United States Patent [19]
Nakamura et al.

[11] Patent Number: 5,703,492
[45] Date of Patent: Dec. 30, 1997

[54] SYSTEM AND METHOD FOR FAULT ANALYSIS OF SEMICONDUCTOR INTEGRATED CIRCUIT

[75] Inventors: Toyokazu Nakamura; Yasuko Hanagama; Tohru Tsujide, all of Tokyo; Kenji Morohashi, Kanagawa, all of Japan

[73] Assignee: NEC Corporation, Tokyo, Japan

[21] Appl. No.: 370,888

[22] Filed: Jan. 10, 1995

[30] Foreign Application Priority Data

Jan. 10, 1994 [JP] Japan ................ 6-000672

[51] Int. Cl.$^6$ .................................. G01R 31/00
[52] U.S. Cl. .................. 324/751; 324/71.3; 250/207
[58] Field of Search ..................... 324/751, 71.3; 250/207

[56] References Cited

U.S. PATENT DOCUMENTS 5,210,487  5/1993  Takahashi et al. ............... 324/71.3

Primary Examiner—Kenneth A. Wieder
Assistant Examiner—Barry C. Bowser
Attorney, Agent, or Firm—Whitham, Curtis, Whitham & McGinn

[57] ABSTRACT

In a fault analysis of large-scale integrated (LSI) circuits, a potential distribution image of a non-defective product and another potential distribution image of a defective product are displayed alternately and continuously in time, so that it is possible to acquire in real time an image of any location within a whole surface of the LSI chip. As a result, it can be viewed as if the potential distribution image of the non-defective product and the potential distribution image of the defective product are overlapped or superimposed with over time. Accordingly, a different portion between the non-defective and defective potential distribution images can be seen distinguishably from a coincident portion between the non-defective and defective potential distribution images, so that it is possible to trace the different portion in real time.

21 Claims, 6 Drawing Sheets

DUTY=HOLD/(RUNNING+HOLD)

SYSTEM AND METHOD FOR FAULT ANALYSIS OF SEMICONDUCTOR INTEGRATED CIRCUIT

BACKGROUND OF THE INVENTION

1. Field of the Invention

The present invention relates to a system and method for fault analysis of an integrated circuit, particularly a logic integrated circuit. More specifically, the present invention relates to a fault analysis capable of making it possible for a person other than an integrated circuit designer to locate a fault position within a short time.

2. Description of Related Art

The integration density of LSIs (large scale integrated circuits) shows a yearly increase, and at present, a logic LSI having several hundred thousand gates has appeared. Such a logic LSI is composed of several million transistors, and therefore, a fault analysis of the LSI needs an extremely long time ever if it is performed by an LSI designer himself.

Conventionally, various methods have been proposed for fault analysis. One typical method is that a test circuit is internally provided in an LSI. However, the conventional methods have different disadvantages, and therefore, have not actually been adopted.

In 1984, T. May proposed a DFI (dynamic fault imaging) method ("Dynamic Fault Imaging of VLSI Random Logic Devices", Reliability Physics Conf. Proc., 1984, pp95–108, the disclosure of which is incorporated by reference in its entirety into this application). This DFI method can be summarized as follows: If an electron beam is irradiated to an LSI chip driven by an LSI tester, secondary electrons are emitted from a surface of the LSI chip. In this situation, if a wiring conductor is at a high potential, most of the emitted secondary electrons are attracted back to the wiring conductor, so that only a very small amount of electrons arrive at an electron detector. On the other hand, if a wiring conductor is at a low potential, many secondary electrons are detected by the electron detector. As a result, a contrast image in accordance with the potential of the wiring conductors can be obtained.

In an EB tester (electron beam tester) utilizing this principle, a defective portion is located in a method illustrated in FIG. 1. In FIG. 1, the axis of ordinates indicates a position of an LSI chip. Namely, an upper end of the axis of ordinates shows a position of bonding pads, and the nearer it becomes to a lower end of the axis of ordinates, the nearer it becomes to a center of the LSI chip. The axis of abscissas is a time axis. Since test patterns (test vectors) for the LSI are sequentially applied to input terminals, the axis of the abscissa can be considered to be the numerical order of the test patterns.

In the EB tester, firstly, a potential contrast image is dynamically acquired while applying different test patterns to a non-defective LSI chip. Next, a potential contrast image is acquired for a defective LSI. Methods fault image is obtained by a difference between the potential contrast image of the non-defective LSI chip and the potential contrast image of the defective LSI. When binary information of "1" and "0" appearing on output bonding pads is different from expected values, the EB tester discriminates that the LSI chip is defective. Then, by tracing the fault image while returning the test pattern number to a smaller number, it is possible to locate a logical occurrence position of the fault portion. Furthermore, it is possible to find out a fault condition by physically analyzing the located fault portion.

For obtaining the above mentioned image within a short time, a CGFI process (Continuous electron beam with Synchronized Gated Signal Acquisition Fault Imaging Technique) has been proposed and reduced to practice. Referring to FIG. 2, there is shown a test vector applied to a logic LSI. If a potential condition in the side of the LSI is acquired at an Nth test vector, namely, at a fourth test vector in the shown example, only the Nth test vector is expanded in comparison with the other test vector, so as to utilize the secondary electrons detected by the electron detector during a period of the Nth test vector. At this time, the primary electron beam is maintained to be irradiated onto the LSI surface. With this method, it is possible to obtain one picture or frame of an image within a very short time such as one second, depending upon the length of the Nth test vector.

In the prior art, the above mentioned images is acquired for each of a non-defective LSI and a defective LSI, and a differential image is obtained so as to approach a position of a fault occurrence portion by tracing back the test vectors in time on the basis of the differential image. In this method, however, a number of images are temporarily stored in a memory of the EB tester, picture by picture. Therefore, the number of patterns to be traced back becomes large. If the position of a fault occurrence portion is remote from a periphery of the LSI chip, it is necessary to acquire an extremely large number of images, and in some cases several hours to more than ten hours are required to locate the position of the fault occurrence portion.

In order to reduce the number of images to be acquired, it is required to prepare a layout or a circuit diagram (which are a design data) or test vectors for internal nodes, and to advance an operation while paying attention to a picture of a location to be acquired next to a preceding picture and a test vector to be applied next.

The number of developed kinds of logic LSIs is increasing steadily, but it is not so easy to increase the number of LSI designers. When a fault is discovered in a product or in the course of mass production, it is the actual circumstance that when a position of the fault portion is traced or located by using the EB tester, a satisfactory fault analysis cannot be obtained because of a shortage of LSI designers and because considerable time is required as mentioned above.

SUMMARY OF THE INVENTION

Accordingly, it is an object of the present invention to provide a system and method for analyzing a fault in a semiconductor integrated circuit, which has overcome the above mentioned defect of the conventional one.

Another object of the present invention is to provide a system and method for analyzing a fault in a semiconductor integrated circuit, in decreased time.

It is considered that the above mentioned disadvantage of the conventional method is due to the fact that the potential image is stored for each one picture and then processed. In view of our consideration, the present invention is to propose to, alternately and continuously in time, output a potential distribution image of a non-defective product or a non-defective condition and another potential distribution image of a defective product or a defective condition. With this arrangement, it is possible to acquire in real time an image of any location within an entire surface of the LSI chip. As a result, it can be viewed as if the potential distribution image of the non-defective product or condition and the potential distribution image of the defective product or condition are overlapped or superimposed with over time. Accordingly, a different portion between the non-defective and defective potential distribution images can be seen distinguishably from a coincident portion between the non-defective and defective potential distribution images, so that it is possible to trace the different portion in real time. Therefore, this approach makes it possible for persons other than LSI designers to trace or approach the fault portion in an extremely short time.

Namely, according to the present invention there is provided a fault analysis system for a semiconductor integrated circuit, configured to locate a fault portion in the semiconductor integrated circuit, comprising means for irradiating an electron beam on a semiconductor integrated circuit, means for detecting the amount of second electrons emitted from the semiconductor integrated circuit, means for applying a sequence of test patterns to the semiconductor integrated circuit, means for making the time of application of a selected test pattern to the semiconductor integrated circuit longer than that of the other test patterns, means coupled to the detecting means and for acquiring a potential distribution image when the selected test pattern is applied to the semiconductor integrated circuit, means coupled to the acquiring means and for displaying the potential distribution image, and means for causing a potential distribution image for a non-defective condition and a potential distribution image for a defective condition to be displayed in real time.

Preferably, the electron beam irradiating means continuously irradiates the electron beam.

In one embodiment, the fault analysis system further includes means for causing the potential distribution image for the non-defective condition and the potential distribution image for the defective condition to be alternately displayed.

Furthermore, the fault analysis system can includes means for calculating in real time a difference in brightness between the potential distribution image for the non-defective condition and the potential distribution image for the defective condition, the calculating means causing a potential difference distribution image to be displayed on the display means in real time.

Alternatively, the fault analysis system can further include means for standardizing the brightness of the potential distribution image for the non-defective condition and the potential distribution image for the defective condition, on the basis of a voltage supply voltage and a signal input voltage applied to the semiconductor integrated circuit in the non-defective condition and the defective condition.

According to another aspect of the present invention there is provided a fault analysis method for a semiconductor integrated circuit, for locating a fault portion in the semiconductor integrated circuit, comprising the steps of irradiating an electron beam on a semiconductor integrated circuit, detecting the amount of second electrons emitted from the semiconductor integrated circuit, applying a sequence of test patterns to a non-defective semiconductor integrated circuit and a defective semiconductor integrated circuit alternately or simultaneously, making the time of application of a selected test pattern to the semiconductor integrated circuit longer than that of the other test patterns, acquiring a potential distribution image when the selected test pattern is applied to the non-defective semiconductor integrated circuit and the defective semiconductor integrated circuit, displaying the potential distribution image, and means for causing a potential distribution image for the non-defective semiconductor integrated circuit and the defective semiconductor integrated circuit to be displayed in real time.

Preferably, the electron beam is continuously irradiated.

In one embodiment, the potential distribution image for the non-defective semiconductor integrated circuit and the potential distribution image for the defective semiconductor integrated circuit, are alternately or simultaneously displayed in the same display or in different displays in real time.

In another embodiment, a difference in brightness between the potential distribution image for the non-defective semiconductor integrated circuit and the potential distribution image for the defective semiconductor integrated circuit, is calculated and displayed in real time.

In still another embodiment, respective locations of the non-defective semiconductor integrated circuit and the defective semiconductor integrated circuit are stored and studied.

In a further embodiment, the non-defective semiconductor integrated circuit and the defective semiconductor integrated circuit are located in the same chamber and are periodically moved together with a frequency on the order of 0.5 Hz to 100 Hz, so that the non-defective semiconductor integrated circuit and the defective semiconductor integrated circuit are alternately positioned before the electron beam.

In a still further embodiment, the potential distribution image for the non-defective semiconductor integrated circuit and the potential distribution image for the defective semiconductor integrated circuit, are colored with different colors.

When the potential distribution image for the non-defective semiconductor integrated circuit and the potential distribution image for the defective semiconductor integrated circuit are displayed on the same position, for example, a deviation in position between the potential distribution image for the non-defective semiconductor integrated circuit and the potential distribution image for the defective semiconductor integrated circuit, is automatically detected, and the detected deviation is fed back to the amount of displacement of the non-defective semiconductor integrated circuit or the defective semiconductor integrated circuit so as to minimize the deviation in position between the potential distribution image for the non-defective semiconductor integrated circuit and the potential distribution image for the defective semiconductor integrated circuit Alternatively, a deviation in position between the potential distribution image for the non-defective semiconductor integrated circuit and the potential distribution image for the defective semiconductor integrated circuit, is detected by an observer, and the position of the non-defective semiconductor integrated circuit or the defective semiconductor integrated circuit is manually displaced so as to minimize the deviation in position between the potential distribution image for the non-defective semiconductor integrated circuit and the potential distribution image for the defective semiconductor integrated circuit.

Furthermore, a selected one of the potential distribution image for the non-defective semiconductor integrated circuit and the potential distribution image for the defective semiconductor integrated circuit may be rotated around a selected point in the selected image.

The above and other objects, features and advantages of the present invention will be apparent from the following description of preferred embodiments of the invention with reference to the accompanying drawings.

DESCRIPTION OF THE PREFERRED EMBODIMENTS

Figure 1:
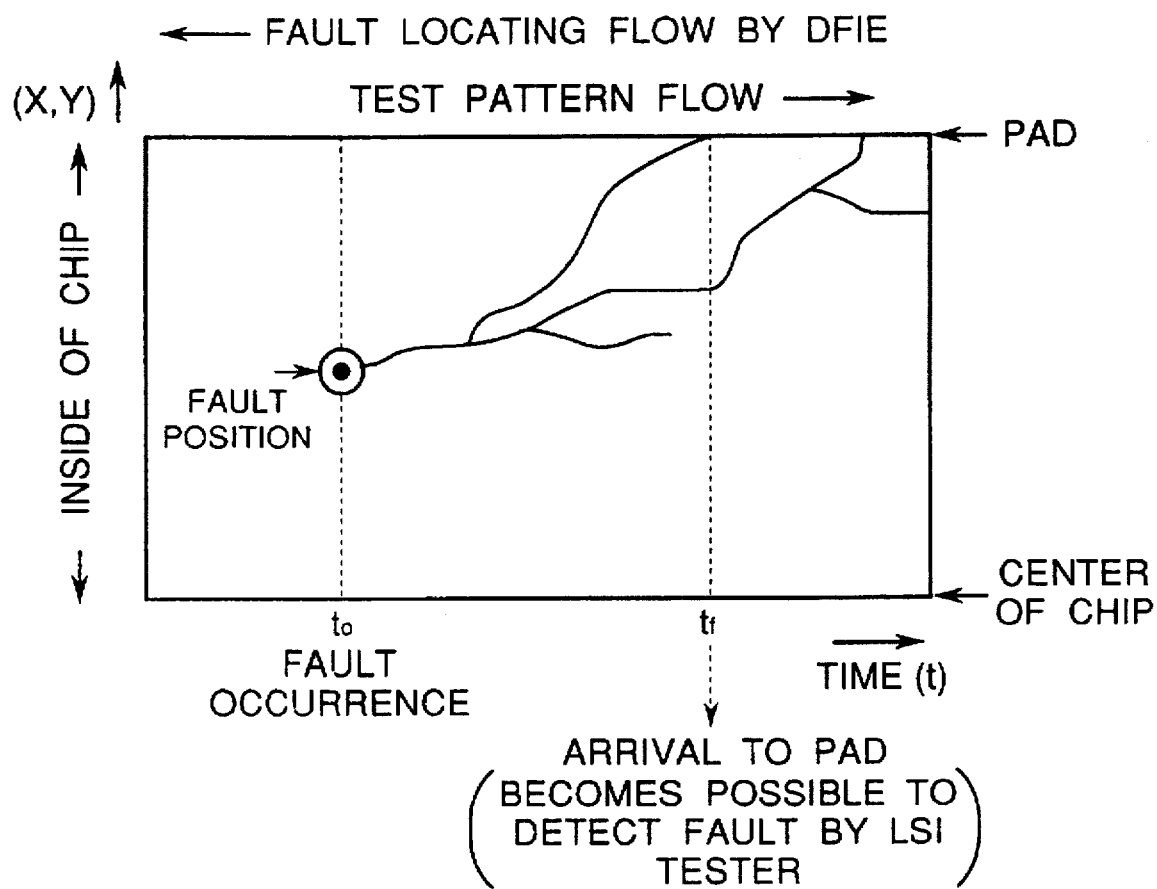
FIG. 1 illustrates a method for locating a defective portion by using an EB tester.
Figure 2:
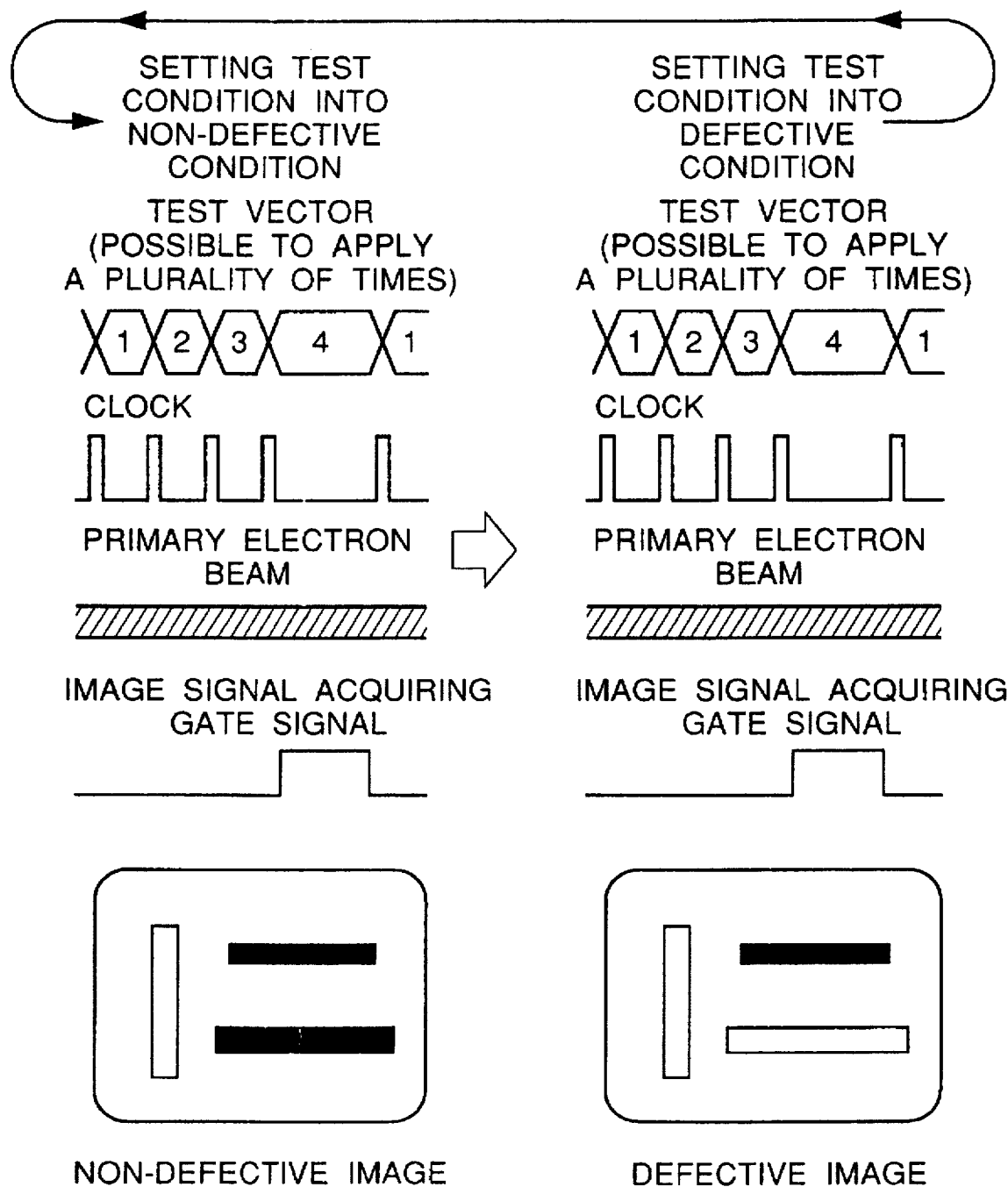
FIG. 2 is a diagram illustrating a first embodiment of the fault analysis in accordance with the present invention.

Referring to FIG. 2, there is shown a diagram for illustrating a first embodiment of the fault analysis system and method in accordance with the present invention. Here, explanation will be made on LSIs having almost no voltage supply voltage margin (which is non-defective under for example Vcc=5 V, but becomes defective under Vcc=5.5 V).

A left half of FIG. 2 shows a case in which a test condition is set to a non-defective condition, and a right half of FIG. 2 shows a case in which a test condition is set to a defective condition. In order from an uppermost portion of the drawing toward a lowermost portion, FIG. 2 illustrates test vectors (for simplification, it is assumed that a defective image can be seen at a fourth test vector), a clock for driving the LSI, an electron beam of the EB tester, a gate signal for acquiring an image signal, and a CGFI potential distribution image of the LSI chip (DUT), respectively. A left side CGFI potential distribution image is indicative of a potential distribution in a non-defective condition, and therefore, will be called a "non-defective image" hereinafter. And, a right side CGFI potential distribution image shows a potential distribution in a defective condition, and therefore, will be called a "defective image" hereinafter.

As mentioned in Japanese Patent Application Laid-open Publication JP-A-5-045423 and Japanese Patent Application No. 173516/1993, a time required to acquire one picture of potential distribution image can be shortened by extending or elongating only a test pattern to be observed.

In this embodiment, the potential distribution image for the non-defective condition (for example, Vcc=5 V) (non-defective image) and the potential distribution image for the defective condition (for example, Vcc=5.5 V) (defective image) are alternately displayed on a screen (display) in real time. This alternate image will be called a "dynamic potential sum image" hereinafter. Assuming that the non-defective image and the defective image are as shown in FIG. 2, only a wiring conductor 2 is depicted in a white and black stripe as shown in the dynamic potential sum image of FIG. 3A.

In the EB tester, an electron beam is scanned at random, and therefore, by suitably selecting the time, it is possible to observe the stripe pattern as if it moves. Wiring conductors 4 and 6 do not have a difference between the non-defective image and the defective image. In other words, the non-defective image and the defective image of the wiring conductors 4 and 6 are white or black, and can be seen as if they are stationary. In the shown example, the potential distribution image for the non-defective image is colored with white, while the potential distribution image for the defective image is colored with black. However, the images are not limited to these colors, and can be another color.

In this embodiment, only an image of the wiring conductor having a difference between the non-defective and defective images is indicated by a moving white-and-black stripe. In addition, the test pattern is maintained to be applied. Accordingly, the image of the wiring conductor having a difference between the non-defective and defective images is indicated in real time as a moving image, regardless of where it appears.

Accordingly, by moving or scrolling the image little by little, it is possible to trace the difference between the non-defective and defective images. If the moving image becomes not observed, the test pattern is set back to a just preceding test pattern, for example, to a third test pattern), and the application of the third test pattern is extended so that the non-defective and defective images based on a third test pattern are alternately displayed. Namely, the "dynamic potential sum image" based on the third test pattern is displayed. If a moving image appears in the "dynamic potential sum image", it starts again to trace the difference between the non-defective and defective images by moving or scrolling the image little by little. These sequential operations are repeated until a test pattern appears in which the moving image is no longer observed at all. Thus, we can reach or trace to a fault portion at last.

Incidentally, in order to displace the potential distribution images of the non-defective and the defective at the same location within a display screen, a deviation in position between the non-defective image and the defective image is automatically detected, and the detected deviation is fed back to the amount of displacement of the non-defective product or the defective product so as to minimize the deviation in position between the non-defective and the defective images. Alternatively, an observer detects the deviation in position between the non-defective and the defective images, and manually moves the setting position of the non-defective product or the defective product so as to minimize the deviation in position between the non-defective and the defective images.

Furthermore, it is possible to rotate the potential distribution images on the display screen around any point within the potential distribution images.

Figure 3A:
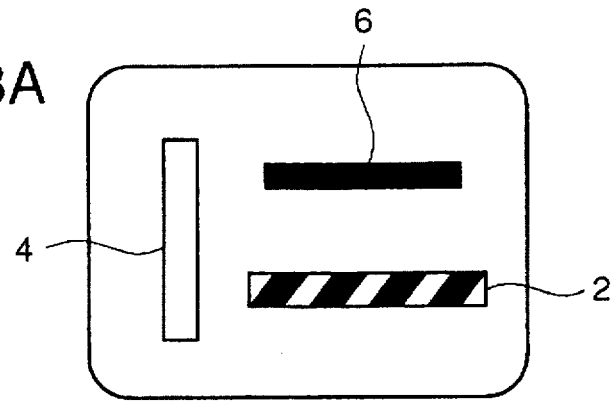
FIGS. 3A to 3D are diagrammatic potential distribution image views for illustrating the first embodiment of the fault analysis in accordance with the present invention.
Figure 3B:
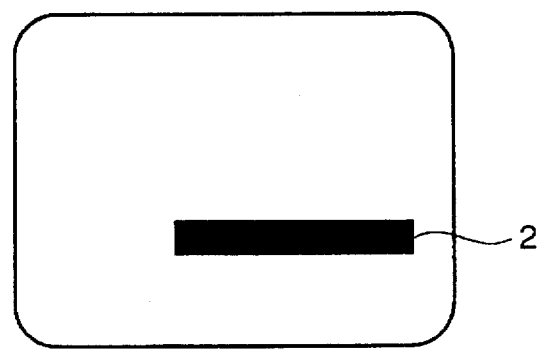

Referring to FIG. 3B, there is shown an example of a displayed image in a case that a difference in brightness between the non-defective and the defective images is calculated in real time, and an image of the difference in brightness is displayed. In this case, since only the fault portion (wiring conductor 2) gives a potential contrast, the image of the wiring conductor 2 is displayed, but the images of the wiring conductors 4 and 6 shown in FIG. 3A are not shown. This system utilizes a differential image between the potential distribution images obtained by the EB tester (called a "dynamic potential difference image"). In this example, since the operation is executed in real time, it becomes easy to trace the above mentioned moving image.

Figure 3C:
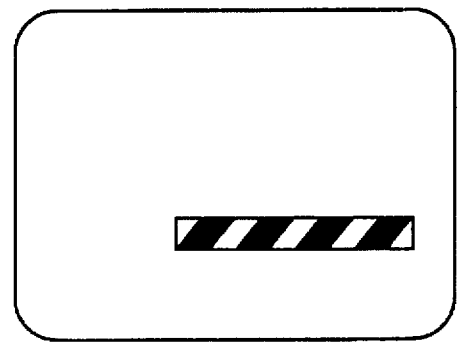
Figure 7:
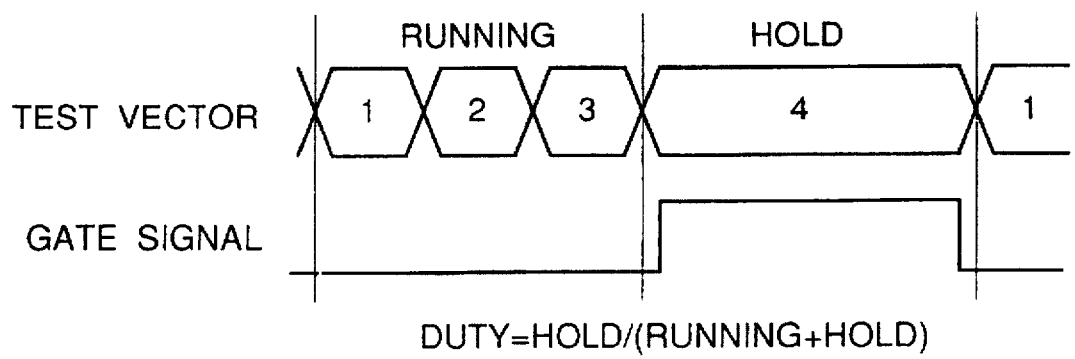
FIG. 7 illustrates a definition of the "duty" used in explaining the present invention.

When electrons are irradiated on the LSI surface, if the wiring conductor potential does not change or if a period in which the wiring conductor potential does not change is larger than a period in which the wiring conductor potential changes, electric charges build/change up on an insulating film surface of the LSI, with the result that it becomes impossible to observe the potential distribution image. As discussed in Y. Hanagama et al "Decrease of the influence of the charge-up in case of the CGFI technique", Industrial Application of Electrically Charged Particle Beam, 132th Committee, 125th Study Meeting Report, pp131-136, December 1993 (the disclosure of which is incorporated by reference in its entirety into this application), if a duty (defined as shown in FIG. 7) is not less than 0.5, the charge-up occurs, and therefore, the wiring conductor cannot be observed if there is no difference between the non-defective and the defective image. However, if there is a difference between the non-defective and the defective image, for example, the wiring conductor 2 is not charged up, and therefore, a stripe pattern image as shown in FIG. 3C can be obtained (which will be called a "dynamic potential difference stripe image"). In other words, if the duty in the CGFI technique is set to a value not less than 0.5, and if the non-defective image and the defective image are alternately displayed in real time, the dynamic potential difference stripe image can be obtained.

Incidentally, as shown in FIG. 7, the duty is defined to be:

Hold/(Running+Hold)

where "Hold" is a period in which the same test pattern is held or maintained, and "Running" is a period in which a plurality of test patterns continuously appear one after another.

Figure 3D:
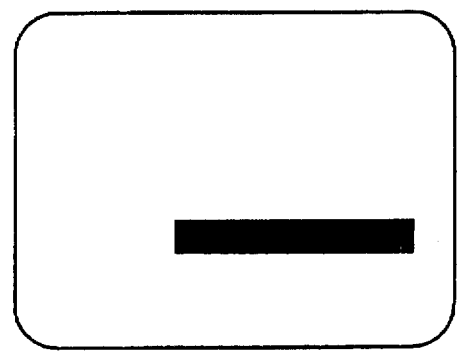

Furthermore, if the duty in the CGFI technique is set to a value not less than 0.5, and if the non-defective image and the defective image are alternately displayed in real time while controlling the gate so as to fetch only one of the non-defective image and the defective image, a black pattern image as shown in FIG. 3D or a white pattern image can be obtained, which will be called a "dynamic potential difference image".

In all the examples shown in FIGS. 3B to 3D, since only the different portion is highlighted, it is easy to trace the image.

As will be apparent from the above, what is needed for fault analysis is only the EB tester and the test patterns which were introduced in the CGFI technique, and no design data is required. In addition, since it is sufficient if the moving image is traced, a person other than the LSI designer can trace and locate a fault occurrence position. In logic LSIs in which a defective image occurs in a 3.5 J pattern, the fault analysis was performed in accordance with the present invention. Only five minutes was entailed in locating a fault near to a center of the LSI chip. This is one tenth of the time required in the conventional method in which the images are traced one after another while storing and processing the image.

Figure 4A:
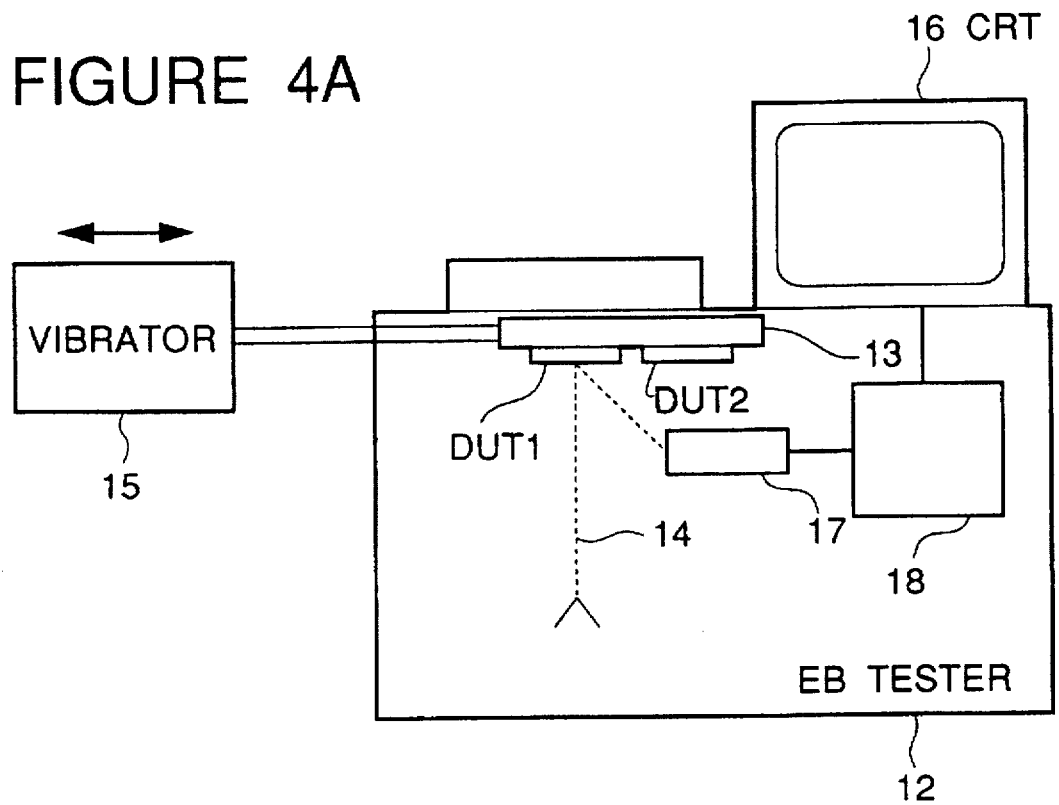
FIGS. 4A and 4B are diagrammatic views showing a second embodiment of the fault analysis in accordance with the present invention.
Figure 4B:
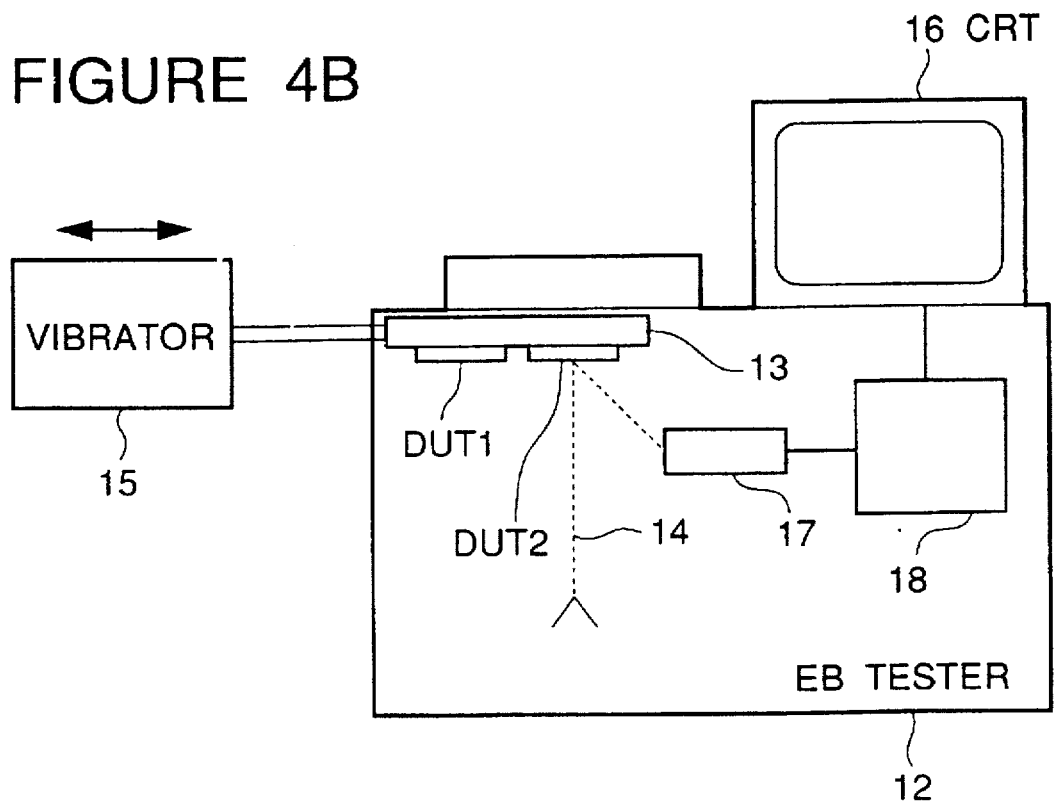

Referring to FIGS. 4A and 4B, there are shown an EB (electron beam) tester which can execute a second embodiment of the present invention. In the first embodiment, the sample which has almost no design margin is analyzed. The second embodiment is configured to specify or locate a fault position of a defective product by using a real time image.

An LSI chip DUT1 a non-defective product and another LSI chip DUT2 a defective product are mounted on a board 13 in an EB tester 12. The same test pattern is applied to both the non-defective product DUT1 and the defective product DUT2. As shown in FIG. 4A, first, an electron beam 14 is irradiated on the non-defective product DUT1, so that the amount of secondary electrons emitted from the non-defective product DUT1, is detected by an electron detector 17, which is coupled to a processing circuit 18 for acquiring a potential distribution image and for outputting the acquired potential distribution image to a CRT display 16. Then, the board 13 on which both the samples are mounted is moved leftward in FIG. 4A, so that the electron beam 14 is irradiated on the defective product DUT2, as shown in FIG. 4B, so that a potential distribution image is acquired and displayed on the CRT display 16.

This alternate application of the electron beam 14 to the non-defective product DUT1 and the defective product DUT2, is realized by a vibrator 15, which reciprocates the board 13 in such a manner that the electron beam 14 is alternately irradiated on the non-defective product DUT1 and the defective product DUT2. A reciprocating period of the vibrator 15 is preferred to be on the order of 0.5 Hz to 100 Hz.

Thus, a non-defective image and a defective image are alternately indicated on the CRT display 16 with very short intervals. Namely, the non-defective image and the defective image are alternately displayed similarly to the first embodiment. In this embodiment, the voltage supply voltage and the signal lines are applied to both the non-defective product DUT1 and the defective product DUT2 in the same condition, so that the same test pattern is maintained to be applied. As a result, the real time image can be obtained.

Figure 5:
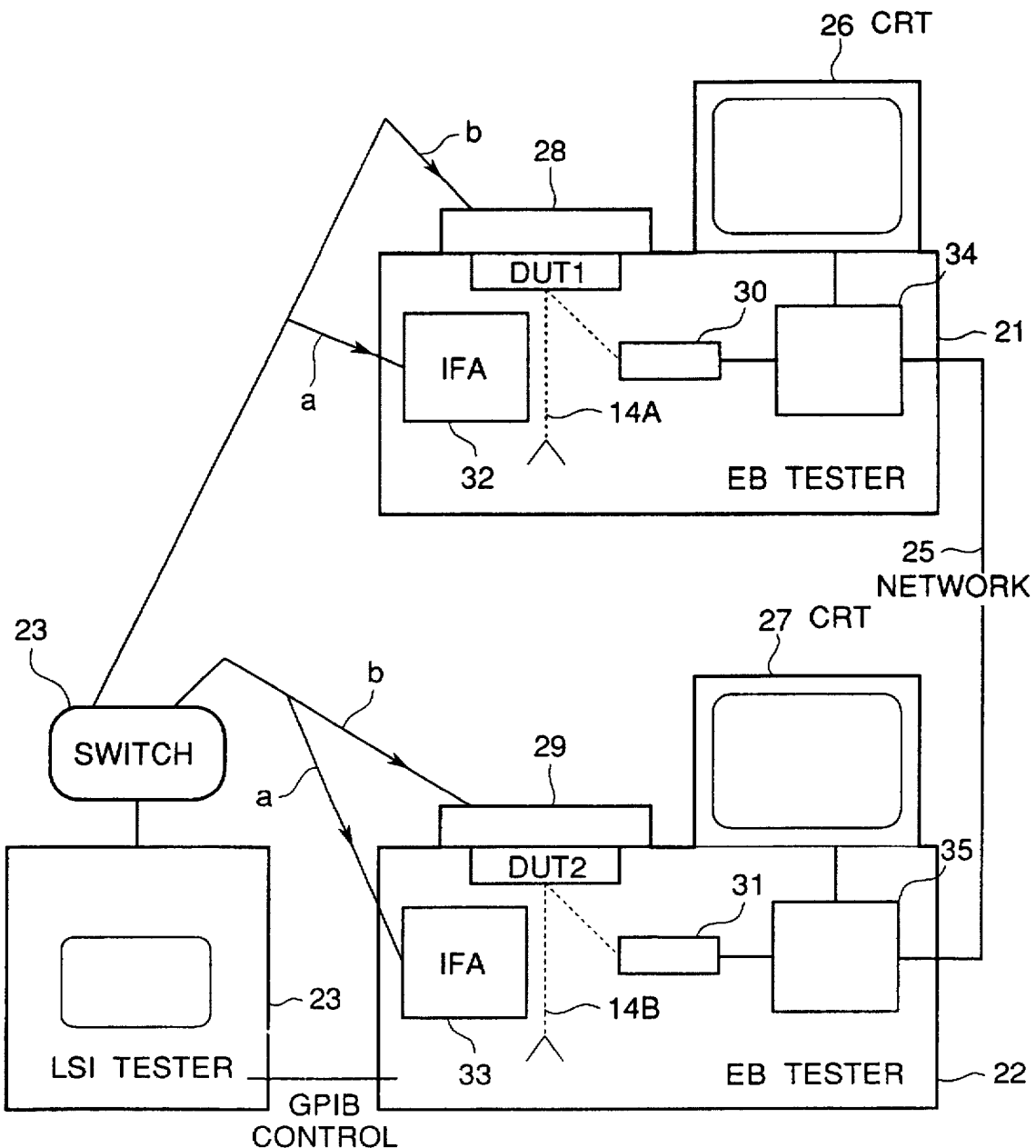
FIG. 5 is a diagrammatic view showing a third embodiment of the fault analysis in accordance with the present invention.

Referring to FIG. 5, there is shown a system which can execute a third embodiment of the present invention. In this third embodiment, a non-defective product and a defective product are not mechanically moved, but two EB testers 21 and 22 are used to irradiate an electron beam on the non-defective product DUT1 and the defective product DUT2, independently of each other. Only one LSI tester 23 is used, and is connected through a change-over switch 24 alternately to the non-defective product DUT1 and the defective product DUT2.

More specifically, the non-defective product DUT1 is mounted on an X-Y stage 28 of the EB tester 21, so that an electron beam 14 is irradiated on the non-defective product DUT1, and the amount of secondary electrons is detected by a detector 30, which is coupled to a processing circuit 34 for acquiring a potential distribution image and for outputting the acquired potential distribution image to a CRT display 26. On the other hand, the defective product DUT2 is mounted on an X-Y stage 29 of the EB tester 22, so that an electron beam 14B is irradiated on the defective product DUT2, and the amount of secondary electrons is detected by a detector 31, which is coupled to a processing circuit 35 for acquiring a potential distribution image and for outputting the acquired potential distribution image to a CRT display 27.

In fact, however, it is sufficient if the two potential distribution images obtained by the electron detectors 30 and 31 and the processing circuits 34 and 35, respectively, are displayed either on the CRT display 26 of the EB tester 21 or on the CRT display 27 of the EB tester 22, through a network 25 which couples together the EB Testers 21 and 22. The two potential distribution images can be superposed on each other, or alternatively, may be displayed in different windows in the same display. In the former case, a difference image or a sum image between the non-defective image and the defective image are displayed as a moving image, similarly to the first and second embodiments. In the latter case, an observer compares the two windows to each other so as to locate a wiring conductor having a difference between the non-defective image and the defective image.

In this third embodiment, the X-Y stages 28 and 29 of the EB testers 21 and 22 are networked through a control bus GPIB so that the movement of the X-Y stages 28 and 29 are interlinked.

Each of the EB testers 21 and 22 includes therein a board 32 or 33 labelled with "IFA" for realizing the CGFI technique. These IFA boards 32 and 33 receive an IFA trigger signal "a" through the change-over switch 24 from the LSI tester 23. In addition, LSI driving signals "a" (test pattern) are supplied from the LSI tester 23 through the change-over switch 24 alternatively to the non-defective product DUT1 or the defective product DUT2.

Incidentally, if the number of pins of the sample LSIs is not greater than a half of the number of pins supplied from the LSI tester, the change-over switch 24 can be omitted.

Figure 6:
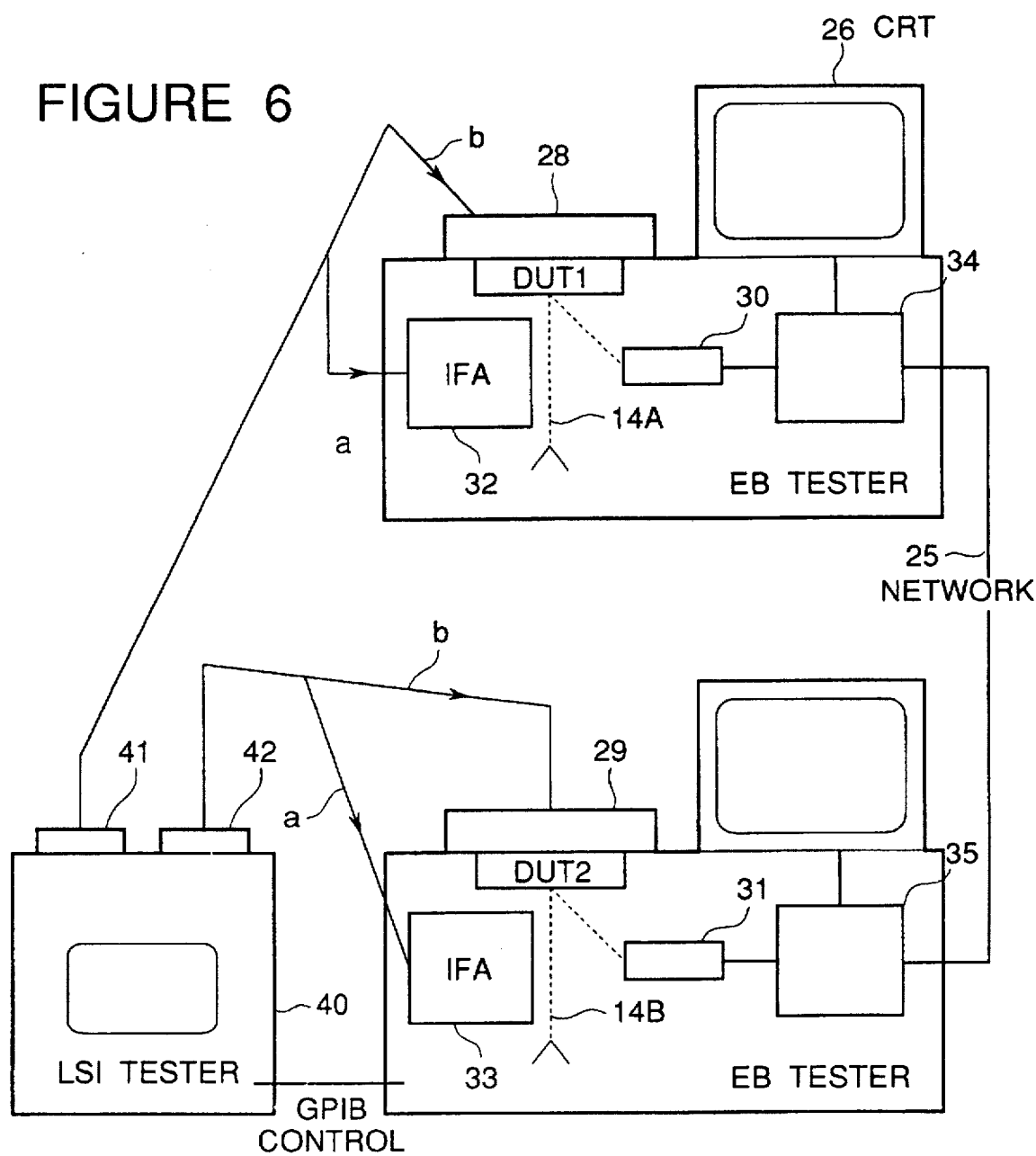
FIG. 6 is a diagrammatic view showing a fourth embodiment of the fault analysis in accordance with the present invention.

Referring to FIG. 6, there is shown a system which can execute a fourth embodiment of the present invention. In FIG. 6, elements similar to those shown in FIG. 5 are given the same reference numerals, and explanation thereof will be omitted.

As mentioned above, in the third embodiment, the test pattern for driving the non-defective product and the defective product is alternately applied through the change-over switch 23. In this fourth embodiment, on the other hand, an LSI tester 40 has a two stations or test heads 41 and 42 for supplying a test pattern to the non-defective product and the defective product, respectively. The fourth embodiment can supply a good quality waveform to the LSI chips, in comparison with the third embodiment in which the test pattern is selectively applied through the change-over switch.

Incidentally, in the fourth embodiment, the test heads 41 and 42 are wired to the two EB testers, respectively. However, the test heads 41 and 42 can be coupled directly to the two EB testers, respectively.

As seen from the above, according to the fault analysis system and method in accordance with the present invention, it is possible to obtain, in a real time, a potential fault image of the semiconductor integrated circuit. Therefore, the fault analysis time can be shortened.

Furthermore, according to the fault analysis system and method in accordance with the present invention, a different portion between a non-defective image and a defective image can be seen distinguishably from a coincident portion between the non-defective image and the defective image, so that it is possible to trace the different portion in real time. Therefore, persons other than LSI designers can trace or approach the fault portion within an extremely short time.

The invention has thus been shown and described with reference to the specific embodiments. However, it should be noted that the present invention is in no way limited to the details of the illustrated structures but changes and modifications may be made within the scope of the appended claims.

We claim:

1. A fault analysis system for a semiconductor integrated circuit, for locating a fault portion in the semiconductor integrated circuit, comprising:

means for continuously irradiating an electron beam on a semiconductor integrated circuit, means for detecting the amount of secondary electrons emitted from said semiconductor integrated circuit, means for applying a sequence of test patterns to said semiconductor integrated circuit, means for making a time of application of a selected test pattern to said semiconductor integrated circuit longer than that of other test patterns, means, coupled to said detecting means, for acquiring a potential circuit to be displayed in real-time, without being temporarily stored in a memory, picture by picture, and asynchronously with acquisition of said potential distribution image, and displaying alternately or simultaneously said potential distribution image for said non-defective semiconductor integrated circuit and said potential distribution image for said defective semiconductor integrated circuit in a same display or in different displays in real-time.

2. A fault analysis system claimed in claim 1 wherein said electron beam irradiating means continuously irradiates said electron beam.

3. A fault analysis system claimed in claim 1 further including means for calculating in real-time a difference in brightness between said potential distribution image for said non-defective condition and said potential distribution image for said defective condition, said calculating means causing a potential difference distribution image to be displayed on said displaying means in real-time.

4. A fault analysis system claimed in claim 1 further including means for standardizing the brightness of said potential distribution image for said non-defective condition and said potential distribution image for said defective condition, on the basis of a voltage supply voltage and a signal input voltage applied to the semiconductor integrated circuit in said non-defective condition and said defective condition.

5. A fault analysis method for a semiconductor integrated circuit, for locating a fault portion in the semiconductor integrated circuit, said method comprising steps of:

irradiating an electron beam on a semiconductor integrated circuit, detecting the amount of secondary electrons emitted from said semiconductor integrated circuit, applying a sequence of test patterns to a non-defective semiconductor integrated circuit and a defective semiconductor integrated circuit alternately or simultaneously, making a time of application of a selected test pattern to said semiconductor integrated circuit longer than that of other test patterns, acquiring a potential distribution image when said selected test pattern is applied to said non-defective semiconductor integrated circuit and said defective semiconductor integrated circuit, causing a potential distribution image for said non-defective semiconductor integrated circuit and said defective semiconductor integrated circuit to be displayed in real-time, and displaying alternately or simultaneously said potential distribution image for said non-defective semiconductor integrated circuit and said potential distribution image for said defective semiconductor integrated circuit in a same display or in different displays in real-time.

6. A fault analysis method claimed in claim 5, further comprising steps of calculating and displaying in real-time a difference in brightness between said potential distribution image for said non-defective semiconductor integrated circuit and said potential distribution image for said defective semiconductor integrated circuit.

7. A fault analysis method claimed in claim 5, further comprising steps of storing and judging respective locations of said non-defective semiconductor integrated circuit and said defective semiconductor integrated circuit.

8. A fault analysis method claimed in claim 5, further comprising steps of:

locating said non-defective semiconductor integrated circuit and said defective semiconductor integrated circuit in a same chamber, and periodically moving said non-defective semiconductor integrated circuit and said defective semiconductor integrated circuit together with a frequency on an order of 0.5 Hz to 100 Hz, so that said non-defective semiconductor integrated circuit and said defective semiconductor integrated circuit are alternately positioned before said electron beam.

9. A fault analysis method claimed in claim 5, further comprising a step of:

coloring said potential distribution image for said non-defective semiconductor integrated circuit and said potential distribution image for said defective semiconductor integrated circuit with different colors.

10. A fault analysis method claimed in claim 5, further comprising steps of:

automatically defecting a deviation in position between said potential distribution image for said non-defective semiconductor integrated circuit and said potential distribution image for said defective semiconductor integrated circuit, and feeding back the detected deviation to an amount of displacement of said non-defective semiconductor integrated circuit or said defective semiconductor integrated circuit, so as to minimize the deviation in position between said potential distribution image for said non-defective semiconductor integrated circuit and said potential distribution image for said defective semiconductor integrated circuit when said potential distribution image for said non-defective semiconductor integrated circuit and said potential distribution image for said defective semiconductor integrated circuit are displayed on a same position.

11. A fault analysis method claimed in claim 5, further comprising steps of:

detecting, by an operator, a deviation in position between said potential distribution image for said non-defective semiconductor integrated circuit and said potential distribution image for said defective semiconductor integrated circuit, and manually displacing the position of said non-defective semiconductor integrated circuit or said defective semiconductor integrated circuit, so as to minimize the deviation in position between said potential distribution image for said non-defective semiconductor integrated circuit and said potential distribution image for said defective semiconductor integrated circuit when said potential distribution image for said non-defective semiconductor integrated circuit and said potential distribution image for said defective semiconductor integrated circuit are displayed on a same position.

12. A fault analysis method claimed in claim 5, further comprising a step of:

rotating a selected one of said potential distribution image for said non-defective semiconductor integrated circuit and said potential distribution image for said defective semiconductor integrated circuit around a selected point in said selected image when said potential distribution image for said non-defective semiconductor integrated circuit and said potential distribution image for said defective semiconductor integrated circuit are displayed on a same position.

13. A fault analysis system according to claim 1, wherein only a difference between said potential distribution image for a defective condition and said potential distribution image for a non-defective condition is on-and-off illuminated, said difference representing a defective portion of said product.

14. A fault analysis system according to claim 1, wherein only a difference between said potential distribution image for a defective condition and said potential distribution image for a non-defective condition is alternately emphasized on said means for displaying, such that a dynamic fault image is obtainable.

15. A fault analysis system according to claim 1, wherein a difference between a portion of said potential distribution image for said non-defective condition and a corresponding portion of said potential distribution image for said defective condition is made distinguishable on said means for displaying.

16. A fault analysis method according to claim 5, further comprising a step of on-and-off illuminating only a difference between said potential distribution image for said defective semiconductor integrated circuit and said potential distribution image for said non-defective semiconductor integrated circuit, such that a dynamic fault image is obtainable, said difference representing a defective portion of said semiconductor integrated circuit.

17. A fault analysis method according to claim 5, further comprising a step of alternately emphasizing only a difference between said potential distribution image for said defective semiconductor integrated circuit and said potential distribution image for said non-defective semiconductor integrated circuit.

18. A fault analysis system according to claim 1, wherein said means for displaying interactively displays said potential distribution images in real-time, such that when a region to be observed is changed, an alternate display can be subsequently obtained in the changed region to be observed.

19. A fault analysis system according to claim 1, wherein one said complete potential distribution image is acquired for a time period no greater than one second.

20. A fault analysis method according to claim 5, wherein said displaying step includes interactively displays said potential distribution images in real-time, such that when a region to be observed is changed, an alternate display can be subsequently obtained in the changed region to be observed.

21. A fault analysis method according to claim 5, wherein one said complete potential distribution image is acquired for a time period no greater than one second.

* * * * *